United States Patent [19]

Cameron et al.

[11] Patent Number: 4,817,100

[45] Date of Patent: Mar. 28, 1989

[54] MONITORING AND CONTROLLING SOURCE STABILITY

[75] Inventors: Keith H. Cameron; David W. Smith, both of Woodbridge, England

[73] Assignee: British Telecommunications PLC, London, England

[21] Appl. No.: 116,565

[22] PCT Filed: Jan. 27, 1987

[86] PCT No.: PCT/GB87/00049

§ 371 Date: Sep. 11, 1987

§ 102(e) Date: Sep. 11, 1987

[87] PCT Pub. No.: WO87/04572

PCT Pub. Date: Jul. 30, 1987

[30] Foreign Application Priority Data

Jan. 27, 1986 [GB] United Kingdom ............... 8602015
Jan. 27, 1986 [GB] United Kingdom ............... 8602016

[51] Int. Cl.$^4$ .............................................. H01S 3/13
[52] U.S. Cl. ..................................... 372/32; 372/28
[58] Field of Search .................... 378/32, 29, 24, 33, 378/28, 9, 38, 26

[56] References Cited

U.S. PATENT DOCUMENTS 4,410,992 10/1983 Javan ................................... 372/32
4,468,773 8/1984 Seaton ................................. 372/32

OTHER PUBLICATIONS

"Investigation of the Stability and Frequency Shifts of a Two-Mode He-Ne-CH4 Laser" 2287 Soviet J. of Quantum Electro: vol. 9, No. 1 (1979.01) pp. 34, 36, 38.
"Optical Phase and Amplitude Measurement by Single Sideband Homodyne Detection" by Edgar Voges, et al., 8106 IEEE Journal of Quantum Electronics vol. QE-18 (1982) Jan. No. 1, New York, USA.
"Linear Scan Control of Tunable Lasers Using a Scanning Fabry-Perot" by M. J. Coulombe and A. S. Pine 2219 Applied Optics, vol. 18, No. 10 (1979.05) pp. 1505, 1507, 1509, 1511.
"Packaged Frequency-Stable Tunable 20 kHz Linewidth 1.5 um InGaAsP External Cavity Laser" Electronics Letters 31 Jan. 1985 vol. 21 No. 3, pp. 113, 115.
Soviet Journal of Quantum Electronics, vol. 9, No. 1, Jan. 1979, American Institute of Physics, (New York, US), M. A. Gubin et al: "Investigation of the Stability and Frequency Shifts of a Two-Mode He-Ne-CH4 Laser", pp. 34-39.
IEEE Journal of Quantum Electronics, vol. QE-18, No. 1, Jan. 1982, IEEE, (New York, US), E. Voges et al: "Optical Phase and Amplitude Measurement by Single Sideband Homodyne Detection", pp. 124-129.
Applied Optics, vol. 18, No. 10, 15 May 1979, Optical Society of America, (New York, US) M. J. Coulombe et al: "Linear Scan Control of Tunable Lasers Using a Scanning Fabry-Perot", pp. 1505-1512.
Electronics Letters, vol. 21, No. 3, 31 Jan. 1985, (New York, US), M. R. Matthews et al: "Packaged Frequency-Stable Tunable 20 kHz Linewidth, 1.5 um InGaAsP External Cavity Laser", pp. 113-115.

Primary Examiner—Leon Scott, Jr.
Attorney, Agent, or Firm—Nixon & Vanderhye

[57] ABSTRACT

A method and apparatus for monitoring and/or controlling the frequency of a beam of coherent radiation. The apparatus comprises a reference source (1) which is controlled to generate reference radiation beam with a frequency which is repeatedly swept through a range of operating frequencies. This reference beam is combined with a beam of coherent radiation from a test source and the combined beams are fed to a photodiode (9). The output of the photodiode (9) can be displayed so that the upper and lower beat frequencies can be determined enabling the variation of the average of the upper and lower beat frequencies with time to be monitored. Alternatively, the average beat frequency can be fed back as a control signal to control the test beam source (8). In this latter case, the frequency of the test beam will be locked.

14 Claims, 3 Drawing Sheets

MONITORING AND CONTROLLING SOURCE STABILITY

The invention relates to methods and apparatus for monitoring and controlling the frequency stability of a source of coherent radiation.

In coherent optical transmission, metrology, spectral analysis and holography there is often a need for lasers with a very stable reference frequency. The external cavity semiconductor laser offers very good short term stability but poor long term stability. By contrast a gas laser, which operates at a frequency determined by an atomic transition, has the potential for excellent long term stability as well as having very good short term stability, but its medium term stability over a period of a few minutes is often poor. This is due to temperature and mechanical variations which change the cavity length, which in turns shifts the mode frequency in the laser gain profile. In practice the frequency of an unstabilised gas laser, such as a HeNe laser, tends to cycle over a range determined by its gain/bandwidth characteristic and its cavity mode spacing. Choice of low expansion materials such as Invar for the laser cavity and careful temperature control will tend to increase the period of the cycles, but there will always be some uncertainty in the absolute frequency of the emission line within the gain profile. For a HeNe laser operating at 1.523 $\mu$m this will be between about 300 MHz and 1 GHz (see paper by Eerkens J. W. and Lee W., "New HeNe lasers with 543 nm and 1523 nm outputs" presented at the conference on lasers and electro-optics (CLEO 85), Baltimore, Md., U.S.A., 21$\mu$24 May 1985).

To achieve greater frequency stability it is possible to use automatic control techniques that rely on a particular spectral feature of the laser. One such feature which is commonly used is the Lamb Dip (Shimoda K, "Stabilisation of the HeNe maser on the atomic line centre", J.Opt.Soc.Am 1964, 54, p. 560). However such features are not always pronounced, particularly if other spectral features of the laser have been optimised, which may take stabilisation using this technique difficult to achieve or unreliable. Alternative laser stabilisation techniques have been developed which use absorption cells. In these, complex features of the absorption spectra of atoms or molecules are identified and interpreted to given an accurate measurement of optical frequency, but for unambiguous operation the control system needs to be complicated.

In accordance with one aspect of the present invention, a method of monitoring the frequency stability of a test source of coherent radiation relatively to a reference source of coherent radiation comprises repeatedly sweeping the frequency of a reference radiation beam generated by the reference source through a range of operating frequencies; causing the reference beam to interfere with the beam from the test source to generate a resultant beam with a beat frequency which varies between upper and lower values; and monitoring the variation of the average of the upper and lower beat frequencies with time.

In accordance with a second aspect of the present invention, apparatus for monitoring the frequency stability of a test source of coherent radiation relatively to a reference source of coherent radiation comprises reference source control means for repeatedly sweeping the operating frequency of a reference radiation beam generated by the reference source through a range of frequencies; interference means for causing the reference beam to interfere with the beam from the test source to generate a resultant beam whose frequency varies between upper and lower values; and monitoring means for determining the upper and lower beat frequencies and for monitoring the variation of the average of the upper and lower beat frequencies with time.

The invention avoids the need to identify complex features of either the output spectrum of a laser or of an absorption cell by using the fact that the gain profile width of certain sources, such as a HeNe laser, is very stable and that the cavity mode spacing is stable to first order and any second order effects on the mode spacing can be readily calculated. Indeed, the stability of the gain profile of a HeNe laser is more than two magnitudes better than that of typical external cavity semiconductor lasers.

By sweeping the operating frequency of the reference source across the gain spectrum, the "edges" of the gain spectrum, as represented by the upper and lower beat frequencies, become observable and it is possible to measure the operating stability against that spectral range by monitoring the average of the upper and lower beat frequencies.

Conveniently, the monitoring step includes the steps of sensing the intensity of the resultant beam, and generating a corresponding electrical signal with a frequency corresponding to the frequency of the resultant beam.

Preferably, the monitoring step includes the steps of determining the upper and lower beat frequencies, determining the difference between the upper and lower beat frequencies, and dividing the difference by two to obtain the average beat frequency.

The monitoring of laser stability by combining a laser beam with a reference laser beam has been mentioned in a paper entitled "Packaged Frequency Stable Tunable 20 kHz Linewidth 1.5 $\mu$m InGaAsP External Cavity Laser", Electron. Lett. 1985, Vol. 21, pp. 113-115 but the present invention differs in an important respect from that earlier method in sweeping the reference frequency through a range of operating frequencies.

The inventive concept can be extended to the control of a source of coherent radiation.

Thus, in accordance with a third aspect of the present invention, a method of locking the frequency of a first source of coherent radiation comprises generating a reference beam of coherent radiation with a frequency which is repeatedly swept through a range of operating frequencies; causing the reference beam to interfere with the beam from the first source to generate a resultant beam with a beat frequency which varies between upper and lower values; determining the average of the upper and lower beat frequencies; and controlling the frequency of the beam from the first source so that the determined average is maintained substantially constant.

In accordance with a fourth aspect of the present invention, apparatus for locking the frequency of a first source of coherent radiation comprises a second, reference source of coherent radiation for generating a reference radiation beam; a reference source control means for repeatedly sweeping the operating frequency of the reference radiation beam through a range of frequencies; interference means for causing the reference beam to interfere with the beam from the first source to generate a resultant beam whose frequency varies between upper and lower values; monitoring means for monitoring the average of the upper and lower beat frequencies and for generating a corresponding control signal; and first source control means responsive to the control signal to control the frequency of the radiation beam generated by the first source such that the monitored average of the upper and lower beat frequencies is maintained substantially constant.

Various apparatus can be used for generating the control signal but preferably the monitoring means comprises a radiation sensor for sensing the intensity of the resultant beam and for generating a corresponding electrical signal; integration or time averaging means responsive to the electrical signal to generate a signal related to the average of the upper and lower beat frequencies of the resultant beam; and comparison means for comparing the signal from the time averaging means with a reference to generate a difference signal constituting the control signal.

In another form of apparatus, a microcomputer could determine the upper and lower frequencies and calculate the average beat frequency, the calculated value then being used to control via a suitable D/A converter a control signal generator.

Preferably, in all aspects of the invention, the frequency of the reference radiation beam is swept in a sinusoidal manner. However, other types of sweep could be used such as a ramp.

The invention is particularly applicable to the locking or monitoring of optical sources such as lasers but can also be used with other types of optical source or indeed non-optical sources such as masers.

An example of a method and apparatus for monitoring and/or locking the frequency of an external cavity laser according to the present invention will now be described with reference to the accompanying drawings, in which.

Figure 1:
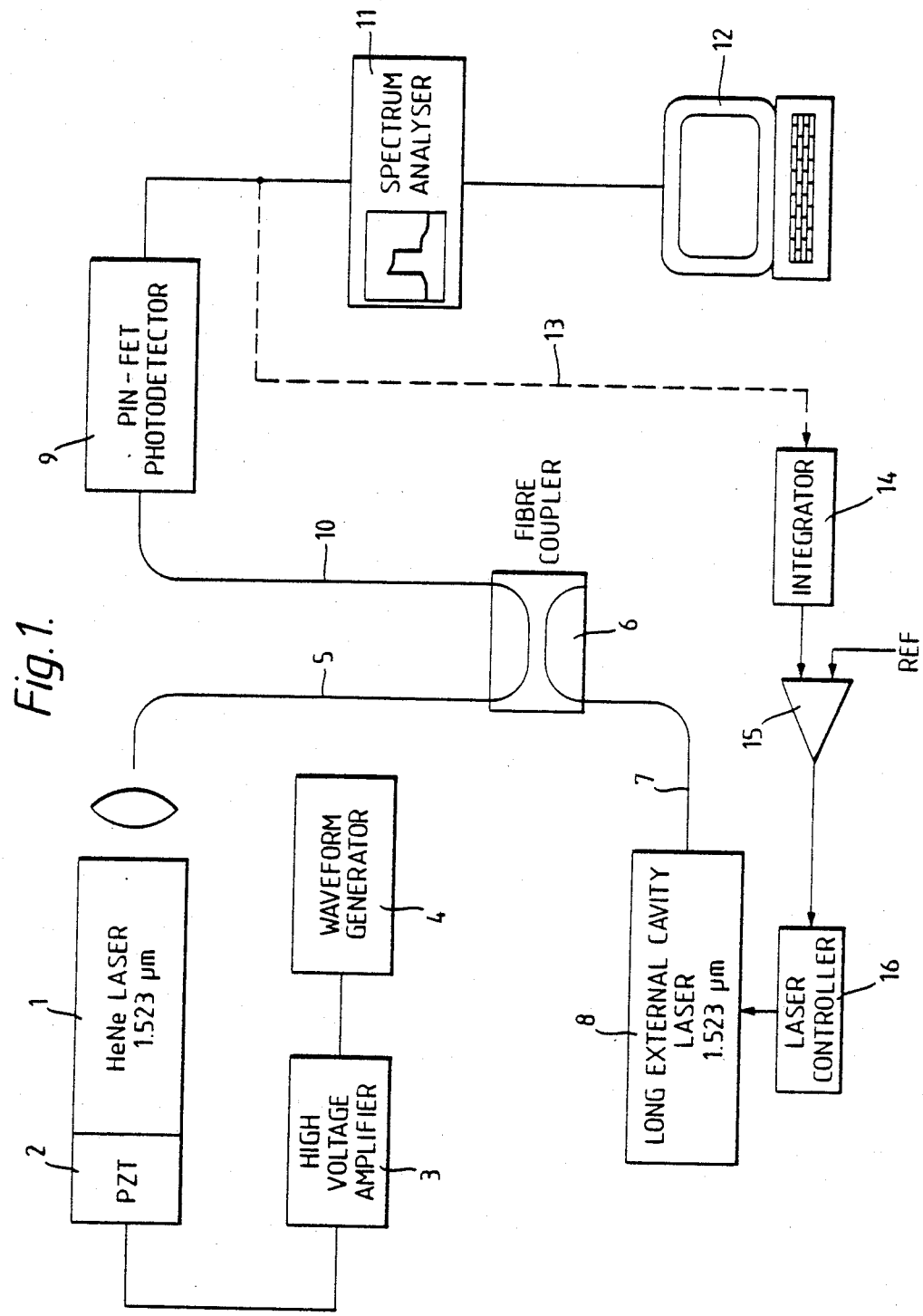
FIG. 1 is a block diagram of the apparatus.

The apparatus shown in FIG. 1 comprises a Spectra Physics Model 120 S HeNe laser 1 with a cavity length of approximately 40 cms. The laser 1 is modified to operate at 1.523 $\mu$m by using suitably coated spherical mirrors of a 40 cm radius of curvature. The mirrors have reflectivities of 96% and 100% respectively. The totally reflecting mirror is mounted on a piezo electric movement 2 and can be scanned over a 5 $\mu$m range by applying 500V from a high voltage amplifier 3. The mirror is scanned by applying a suitable signal to the amplifier 3 from a signal generator 4 In one example, a sinusoidal signal having a frequency of about 1 kHz is used.

The drive signal is selected to have a sufficient amplitude to drive the piezo electric movement 2 over nearly its full range to ensure that the cavity mode is swept in frequency over several mode spacings. The scanning of the mirror will also change the mode spacing, but this variation will be small. In a 40 cm long cavity with a nominal mode spacing of about 375 MHz, a five $\mu$m movement will change the mode spacing by less than 10 kHz.

The reference optical beam of radiation from the laser 1 is fed along an optical fibre 5 to one input port of an optical fibre coupler 6. The other input port of the coupler 6 is connected via an optical fibre 7 with a long external cavity semiconductor laser 8. The output beam from the laser 8 is guided along the optical fibre 7 to the coupler 6 where the two beams are combined and then heterodyned together on a PIN-FET photodiode 9 to which they are guided by an optical fibre 10. The electrical output signal from the photodiode 9 is fed to a conventional spectrum analyser 11 connected with a computer 12 such as an HB9816.

Figure 2:
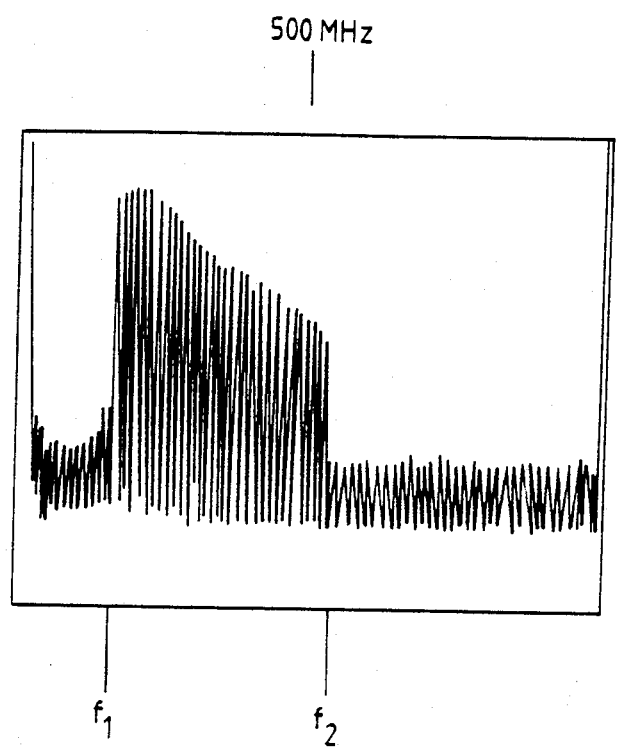
FIG. 2 illustrates a typical IF spectrum as displayed by the spectrum analyser shown in FIG. 1; and, FIG. 3 illustrates graphically the variation of the upper and lower beat frequencies, the difference frequency, and the average frequency with time.

FIG. 2 illustrates the electrical output from the photodiode 9 as displayed on the spectrum analyser 11 and shows the frequency modulated IF signal composed of beat frequencies varying between lower and upper frequencies $f_1$, $f_2$. The spectrum displayed is the result of the signal from the laser 8 under test being heterodyned with the signal from the laser 1 producing a swept IF frequency. The slope of the IF spectrum is caused by misalignment of the scanning mirror and the bandwidth limitation of the photodetector. The peak to peak frequency excursions, determined by the gain/bandwidth characteristic of the laser and its mode spacing, can be considered to remain constant. Thus changes in the position of the IF spectrum directly indicate changes in the frequency of the semiconductor laser being measured.

The beat frequency spectrum is analysed by the computer 12 which measures the frequencies of the first rising edge $f_1$ and the last falling edge $f_2$. From these values, the difference frequency $f_d$ and the average frequency $f_a$ are calculated. The difference frequency measurement is carried out in order to check that the measurement system is working correctly. The average frequency measurement gives a direct reading of the frequency stability of the laser 8 under test.

Figure 3:
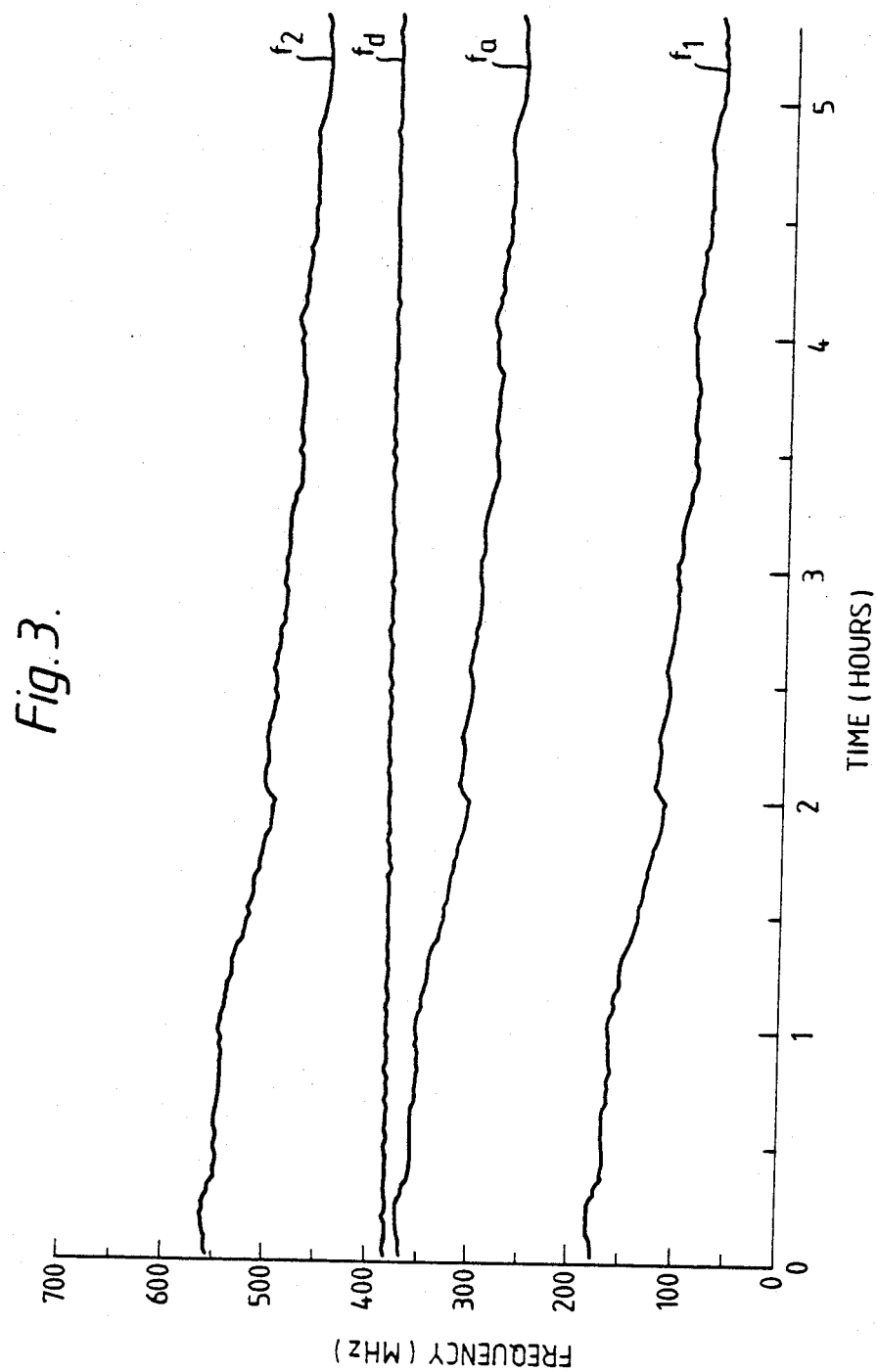

FIG. 3 shows the variation of these various frequencies with time and it can be seen that the difference frequency $f_d$ remains substantially constant over the five hour measurement period, varying by only $\pm 2$ MHz. The average frequency, $f_a$, however, varies by about 100 MHz directly showing the frequency drift of the test laser 8.

FIG. 1 illustrates an additional connection 13 between the photodiode 9 and an integrator or time averager 14. This could be provided as an alternative to the spectrum analyser 11 and computer 12 or, with the use of a suitable optical splitter, in combination with the monitoring system. The integrator 14 determines the average beat frequency and feeds an appropriate electrical signal to a comparator 15. The comparator 15 compares the incoming signal with a reference and generates an electrical control signal representing the difference between the two input signals. This control signal is fed to a conventional laser control unit 16 which may vary the cavity length of the laser 8 or the orientation of the diffraction grating of the laser 8.

With this feedback loop, the frequency of the optical signal generated by the laser 8 is locked relatively to the frequency of the reference beam from the laser 1. It should be noted that although in theory the frequency of the reference beam need only be swept through two modes, it is preferable, as seen in FIG. 2, if the reference beam frequency is swept through a large number of modes.

The invention could be extended to the stability measurement or control of lasers having different frequencies by use of a system using a transfer standard such as a Fabry-Perot interferometer. In this case, the stabilised beam from the laser 8 is used to lock one passband of the interferometer. The interferometer is then used to measure the frequency stability of other lasers at a whole range of wavelengths using standard techniques.

We claim:

1. A method of monitoring the frequency stability of a test source of coherent radiation relatively to a reference source of coherent radiation, the method comprising repeatedly sweeping the frequency of a reference radiation beam generated by the reference source through a range of operating frequencies; causing the reference beam to interfere with the beam from the test source to generate a resultant beam with a plurality of beat frequencies which varies between an upper and a lower value; and monitoring the variation of the average of the upper and lower beat frequencies with time.

2. A method according to claim 1, wherein the monitoring step includes the steps of sensing the intensity of the resultant beam, and generating a corresponding electrical signal with a frequency corresponding to the frequency of the resultant beam.

3. A method according to claim 1 or claim 2, wherein the monitoring step includes the steps of determining the upper and lower beat frequencies, determining the difference between the upper and lower beat frequencies, and dividing the difference by two to obtain the average beat frequency.

4. A method of locking the frequency of a first source of coherent radiation, the method comprising generating a reference beam of coherent radiation with a frequency which is repeatedly swept through a range of operating frequencies; causing the reference beam to interfere with the beam from the first source to generate a resultant beam with a beat frequency which varies between upper and lower values; determining the average of the upper and lower beat frequencies; and controlling the frequency of the beam from the first source so that the determined average is maintained substantially constant.

5. A method according to claim 4, wherein the detecting step includes the steps of sensing the intensity of the resultant beam, and generating a corresponding electrical signal with a frequency corresponding to the frequency of the resultant beam.

6. A method according to claim 5 or claim 4, wherein the detecting step includes the steps of determining the upper and lower beat frequencies, determining the difference between the upper and lower beat frequencies, and dividing the difference by two to obtain the average beat frequency.

7. A method according to any of the preceding claims 1, 2, 4 or 5, wherein the reference beam frequency is swept in a sinusoidal manner.

8. A method according to any of the preceding claims 1, 2, 4 or 5, wherein the reference beam is generated by a laser or a maser, the reference beam being swept through at least two modes.

9. Apparatus for monitoring the frequency stability of a test source of coherent radiation relatively to a reference source of coherent radiation, the apparatus comprising reference source control means for repeatedly sweeping the operating frequency of a reference radiation beam generated by the reference source through a range of frequencies; interference means for causing the reference beam to interfere with the beam from the test source to generate a resultant beam whose frequency varies between upper and lower values; and monitoring means for determining the upper and lower beat frequencies and for monitoring the variation of the average of the upper and lower beat frequencies with time.

10. Apparatus for locking the frequency of a first source of coherent radiation, the apparatus comprising a second, reference source of coherent radiation for generating a reference radiation beam; a reference source control means for repeatedly sweeping the operating frequency of the reference radiation beam through a range of frequencies; interference means for causing the reference beam to interfere with the beam from the first source to generate a resultant beam whose frequency varies between upper and lower values; monitoring means for monitoring the average of the upper and lower beat frequencies and for generating a corresponding control signal; and first source control means responsive to the control signal to control the frequency of the radiation beam generated by the first source such that the monitored average of the upper and lower beat frequencies is maintained substantially constant.

11. Apparatus according to claim 10 wherein the monitoring means comprises a radiation sensor for sensing the intensity of the resultant beam and for generating a corresponding electrical signal; integration or time averaging means responsive to the electrical signal to generate a signal related to the average of the upper and lower beat frequencies of the resultant beam; and comparison means for comparing the signal from the time averaging means with a reference to generate a difference signal constituting the control signal.

12. Apparatus according to any one of claims 9 to 11, wherein the reference source control means causes the frequency of the reference radiation beam to be swept in a sinusoidal manner.

13. Apparatus according to any one of claims 9 to 12, wherein the radiation sources comprise lasers or masers.

14. Apparatus according to claim 13, wherein the reference source comprises a HeNe laser.

* * * * *